(12) United States Patent
Kim et al.

(10) Patent No.: US 8,946,883 B2
(45) Date of Patent: Feb. 3, 2015

(54) WAFER LEVEL FAN-OUT PACKAGE WITH A FIDUCIAL DIE

(71) Applicant: Amkor Technology, Inc., Chandler, AZ (US)

(72) Inventors: Sung Kyu Kim, Seoul (KR); Jin Young Kim, Seoul (KR); Yoon Joo Kim, Seoul (KR); Jin Han Kim, Gyeonggi-do (KR); Seung Jae Lee, Gyeonggi-do (KR); Se Woong Cha, Gyeonggi-do (KR); Jae Hun Bae, Gyeongsangbuk-do (KR); Dong Jin Kim, Jeollanam-do (KR); Won Myoung Ki, Gyeonggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 13/963,384

(22) Filed: Aug. 9, 2013

(65) Prior Publication Data

US 2014/0077366 A1 Mar. 20, 2014

(30) Foreign Application Priority Data

Sep. 20, 2012 (KR) .......................... 10-2012-0104430

(51) Int. Cl.

| H01L 23/498 | (2006.01) |
| H01L 21/56 | (2006.01) |
| H01L 23/48 | (2006.01) |
| H01L 23/544 | (2006.01) |
| H01L 23/00 | (2006.01) |
| H01L 23/31 | (2006.01) |

(52) U.S. Cl.
CPC .......... *H01L 23/49811* (2013.01); *H01L 21/56* (2013.01); *H01L 23/481* (2013.01); *H01L 23/48* (2013.01); *H01L 23/498* (2013.01); *H01L 21/561* (2013.01); *H01L 23/544* (2013.01); *H01L 24/96* (2013.01); *H01L 23/3107* (2013.10); *H01L 21/568* (2013.01); *H01L 2223/54426* (2013.01); *H01L 2223/54486* (2013.01); *H01L 2224/12105* (2013.01)
USPC ............ 257/690; 257/678; 257/797; 438/15; 438/126

(58) Field of Classification Search
USPC ............... 257/48, 678, 737, 797; 438/15, 126
See application file for complete search history.

(56) References Cited

U.S. PATENT DOCUMENTS

| 5,250,843 A | 10/1993 | Eichelberger |
| 5,353,498 A | 10/1994 | Fillion et al. |

(Continued)

FOREIGN PATENT DOCUMENTS

JP 2001118947 10/1999

OTHER PUBLICATIONS

CAD_CIM Requirements Article IMAPS.

*Primary Examiner* — Daniel Shook
(74) *Attorney, Agent, or Firm* — McAndrews, Held & Malloy

(57) ABSTRACT

A wafer level fan-out package with a fiducial die is disclosed and may include a semiconductor die and a transparent fiducial die both encapsulated in a molding compound resin, passivation layers on an upper surface and a lower surface of the molding compound resin except where redistribution layers are formed on upper and lower surfaces of the molding compound resin, and a metal pattern on a lower surface of the transparent fiducial die that is visible through an exposed upper surface of the transparent fiducial die. The pattern may comprise a standard coordinate for forming a through mold via utilizing laser drilling.

20 Claims, 11 Drawing Sheets

(56) References Cited

U.S. PATENT DOCUMENTS

| | | |
|---|---|---|
| 5,497,033 A | 3/1996 | Fillion et al. |
| 5,841,193 A | 11/1998 | Eichelberger |
| 6,159,767 A | 12/2000 | Eichelberger |
| 6,486,005 B1 | 11/2002 | Kim |
| 6,727,576 B2 | 4/2004 | Hedler |
| 6,838,776 B2 | 1/2005 | Leal |
| 6,845,554 B2 | 1/2005 | Frankowsky et al. |
| 6,905,914 B1 | 6/2005 | Huemoeller et al. |
| 6,921,975 B2 | 7/2005 | Leal |
| 7,015,075 B2 | 3/2006 | Fay et al. |
| 7,192,807 B1 | 3/2007 | Huemoeller et al. |
| 7,196,408 B2 | 3/2007 | Yang et al. |
| 7,202,107 B2 | 4/2007 | Fuergut et al. |
| 7,238,602 B2 | 7/2007 | Yang |
| 7,247,523 B1 | 7/2007 | Huemoeller et al. |
| 7,262,081 B2 | 8/2007 | Yang et al. |
| 7,326,592 B2 | 2/2008 | Meyer et al. |
| 7,339,279 B2 | 3/2008 | Yang |
| 7,361,987 B2 | 4/2008 | Leal |
| 7,405,102 B2 | 7/2008 | Lee et al. |
| 7,420,272 B1 | 9/2008 | Huemoeller et al. |
| 7,459,781 B2 * | 12/2008 | Yang et al. .......... 257/700 |
| 7,623,733 B2 | 11/2009 | Hirosawa |
| 2006/0192301 A1 | 8/2006 | Leal et al. |
| 2006/0231958 A1 | 10/2006 | Yang |
| 2007/0059866 A1 | 3/2007 | Yang et al. |
| 2008/0105967 A1 | 5/2008 | Yang et al. |
| 2008/0128884 A1 | 6/2008 | Meyer et al. |
| 2008/0142960 A1 | 6/2008 | Leal et al. |
| 2008/0182363 A1 | 7/2008 | Amrine et al. |
| 2009/0051025 A1 | 2/2009 | Yang et al. |

* cited by examiner

US 8,946,883 B2

WAFER LEVEL FAN-OUT PACKAGE WITH A FIDUCIAL DIE

CROSS REFERENCE TO RELATED APPLICATIONS

The present application makes reference to, claims priority to, and claims the benefit of Korean Patent Application No. 10-2012-0104430, filed on Sep. 20, 2012, the contents of which are hereby incorporated herein by reference, in their entirety.

FIELD OF THE INVENTION

Certain embodiments of the invention relate to semiconductor chip packaging. More specifically, certain embodiments of the invention relate to a wafer level fan-out package with a fiducial die.

BACKGROUND OF THE INVENTION

In recent years, chip scale packaging technologies for packaging the individual chip at wafer-level in accordance with the requirements for high integration, weight lightening, thickness reduction, shortening the length and miniaturization of the semiconductor package have been applied to the related art field.

As one example of the chip scale packaging technologies, there is a Wafer Level Fan-In Package of which input/output terminals such as solder balls for transmitting an electric signal within a section of the respective chip are connected thereto. Another such case is Wafer Level Fan-Out Package of which a conductive line can extend to a peripheral portion of the respective chip by using a separate interposer, etc. and input/output terminals are melted and attached to the extended portion of the conductive line.

Further limitations and disadvantages of conventional and traditional approaches will become apparent to one of skill in the art, through comparison of such systems with the present invention as set forth in the remainder of the present application with reference to the drawings.

FIELD OF THE INVENTION

The present invention to a semiconductor device and a method of manufacturing the same, which is capable of accurately recognizing the point of a laser drilling on a molding compound resin while making a Wafer Level Fan-Out Package by employing a fiducial die having an improvement structure.

BRIEF SUMMARY OF THE INVENTION

A wafer level fan-out package with a fiducial die, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a semiconductor package and manufacturing method thereof. Example aspects of the invention may comprise a semiconductor die and a transparent fiducial die both encapsulated in a molding compound resin, passivation layers on an upper surface and a lower surface of the molding compound resin except where redistribution layers are formed on upper and lower surfaces of the molding compound resin, and a metal pattern on a lower surface of the transparent fiducial die that is visible through an exposed upper surface of the transparent fiducial die. The pattern may comprise a standard coordinate for forming a through mold via utilizing laser drilling. The through mold via may extend from the upper surface to the lower surface of the molding compound resin for electrically coupling a redistribution layer on the upper surface of the molding compound resin to a redistribution layer on the bottom surface of the molding compound resin. The pattern may be embedded in the lower surface of the fiducial die. The pattern may be deposited on the lower surface of the fiducial die. The redistribution layer on the lower surface of the molding compound resin may be electrically coupled to a bonding pad on the semiconductor die. An input/output terminal may be formed on the redistribution layer on the upper surface of the molding compound resin. The input/output terminal may comprise a solder bump. The transparent fiducial die may be thicker than the semiconductor die. The transparent fiducial die may comprise a glass material. The pattern on the lower surface of the transparent fiducial die may comprise the same material as the redistribution layer on the on the bottom surface of the molding compound resin. The formed through mold via may comprise a conductive metal material.

The manufacturing process for a typical wafer level fan-out package, which is a type of chip scale package will be described with reference to the attached drawings FIGS. 3A to 3H.

Figures 3A, 3B:
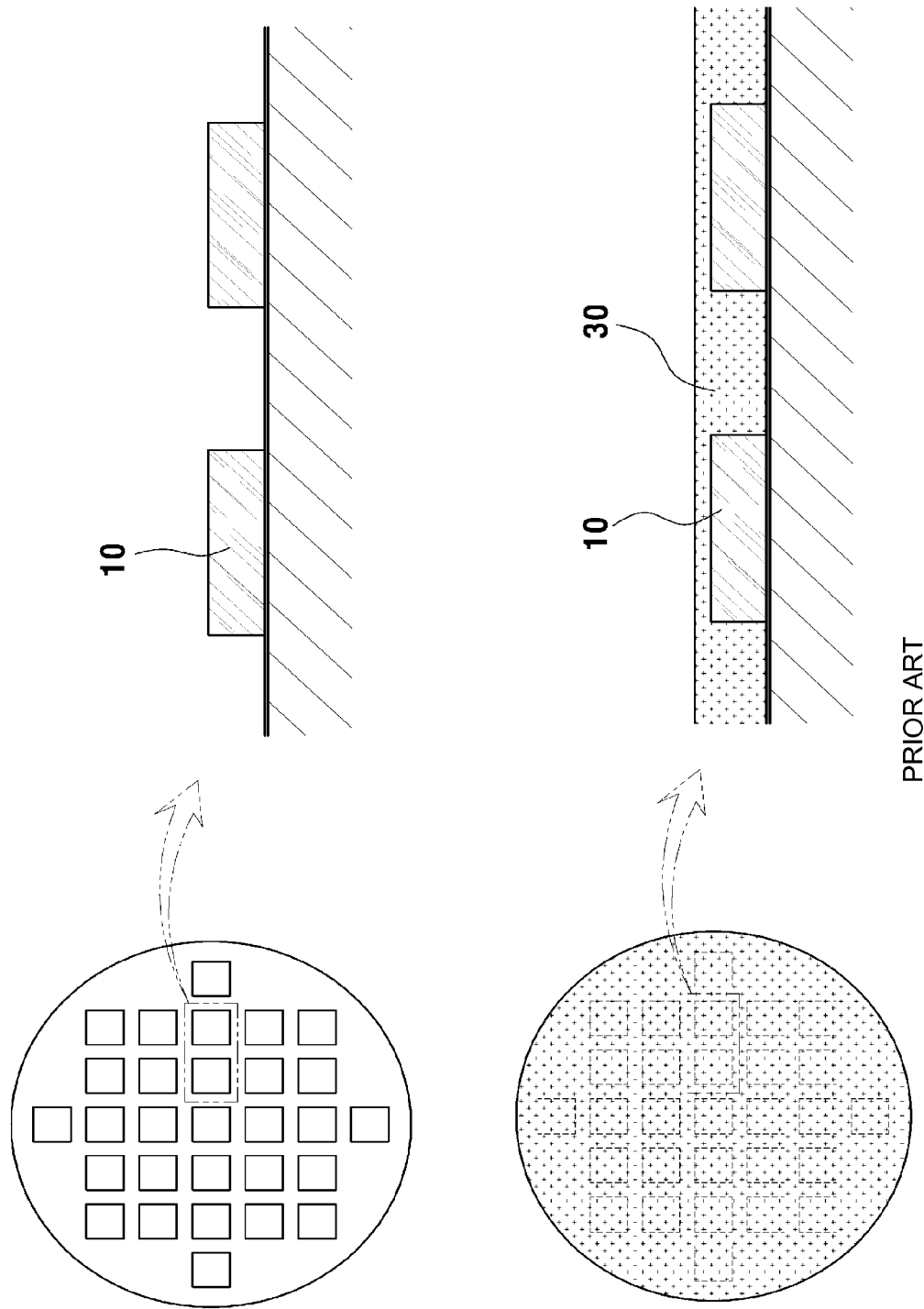
FIG. 3A-3H is a sectional view illustrating a Wafer Level Fan-Out Package and a method of manufacturing the same according to the prior art.

First, individual chips (10) separated from a wafer are attached to an adhesive surface such as a tape or a carrier at a lower surface thereof with predetermined intervals. Typically, a surface on which a boding pad was provided is attached to the adhesive surface (as shown in FIG. 3A). The bonding pad can function as an input/output pad for electric signal.

Next, all of chips (10) are molded together by means of the molding compound resin (30) so that upper and side surfaces of the individual chips (10) are encapsulated and guarded by the molding compound resin (30), as shown in FIG. 3B.

Thereafter, if the molding compound resin (30) encapsulating the individual chip (10) is forcibly detached from the adhesive surface, the lower surface on which the bonding pad is provided of the individual chips may be externally exposed. Then, in order to make lower and upper surfaces of the molding compound resin (30) as smooth as possible, a grinding process is utilized followed by a cleaning process on the lower surface of the chip.

Next, a lower redistribution layer (32), which is a kind of metal distribution layer, may be formed from a bonding pad

Figures 3C, 3D:
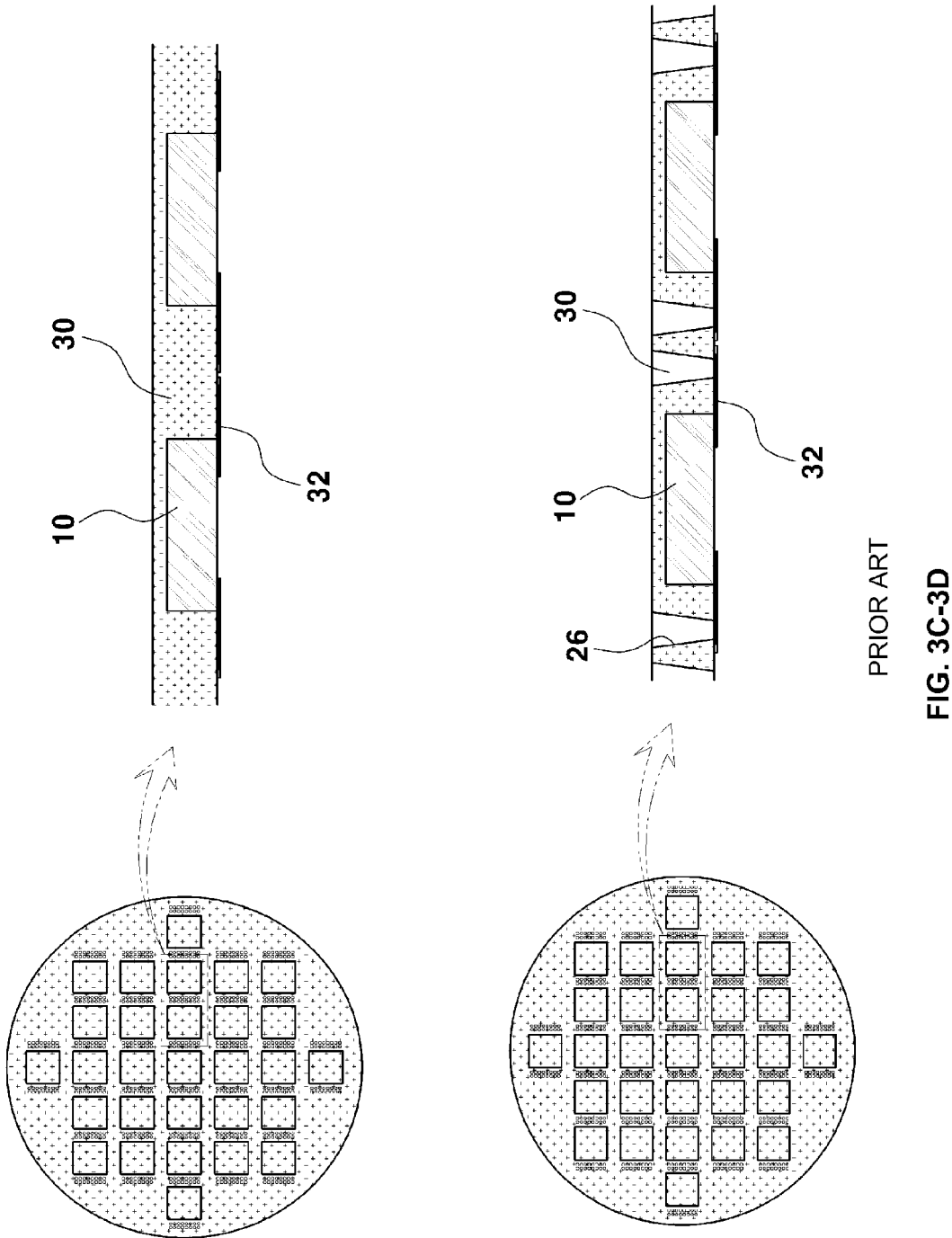

(12) of the individual chip (10) to a desired position on the lower surface of the molding compound resin (30), as shown in FIG. 3C.

If input/output terminals, such as solder balls, are attached to the bonding pads of the individual chips with a fine pitch there between, an electrical short may occur due to the direct contact between the input terminal and the output terminal. In order to solve this problem, a metal redistribution layer is provided. Accordingly, the metal redistribution layer extends from the bonding pad to the outside so as to allow the input/output terminals to be attached to the bonding pad while maintaining a wider gap there between.

Next, a passivation layer is typically formed at a surface of the chip everywhere except where the bonding pad is located. Thereafter, a redistribution layer is formed utilizing a plating process. Then, an insulating passivation layer is formed on the redistribution layer in order to prevent moisture and other foreign substances from permeating into the redistribution layer and to prevent electrical shorts between the redistribution layers. It should be noted that, for the sake of clarity and understanding of the invention, a detailed explanation about this process will be omitted.

Figures 3E, 3F:
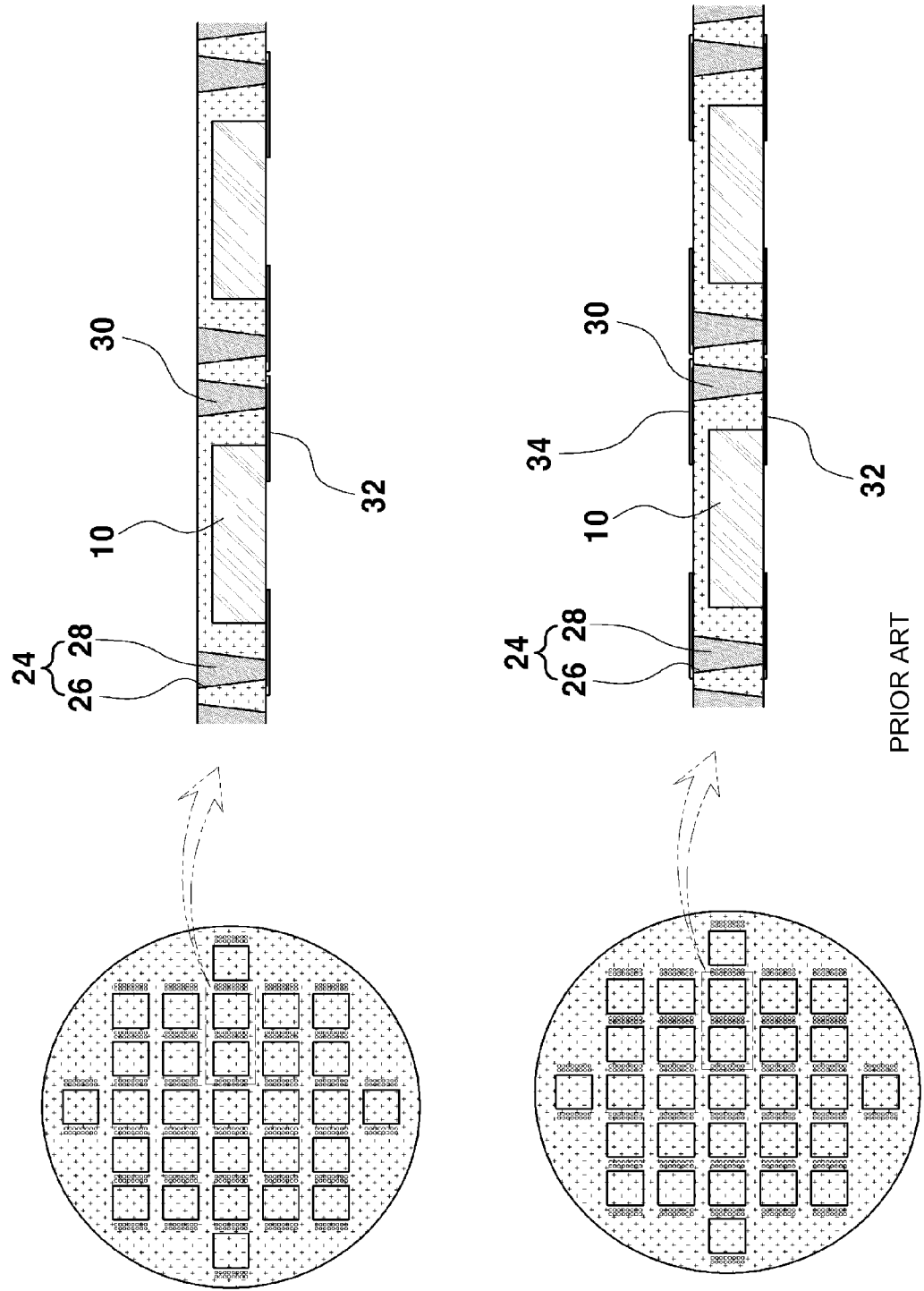

Next, a through mold via (24) may be formed at the molding compound resin (30) by using laser processing, as shown in FIGS. 3D and 3E.

A plurality of through mold vias (24) may be formed at certain positions around the chips (10) with equal intervals. The through mold via (24) may be formed by performing the steps: forming a via hole (26) from the upper surface of the molding compound resin (30) to the lower surface on which the lower redistribution layer (32) is provided, using laser processing, as shown in FIG. 3D. Foreign substances are then removed from an inner circumferential surface and surroundings of the via hole (26), followed by plating or filling of the lower redistribution layer 32 and a conductive metal (28), such as a metal paste, in the via hole (26) as shown in FIG. 3E.

Thereafter, an upper redistribution layer (34) may be formed from an upper end of the through via hole (22) to a desired position on an upper surface of the molding compound resin (30) similarly to the formation of the lower redistribution layer (32), and as shown in FIG. 3F.

Figure 3G:
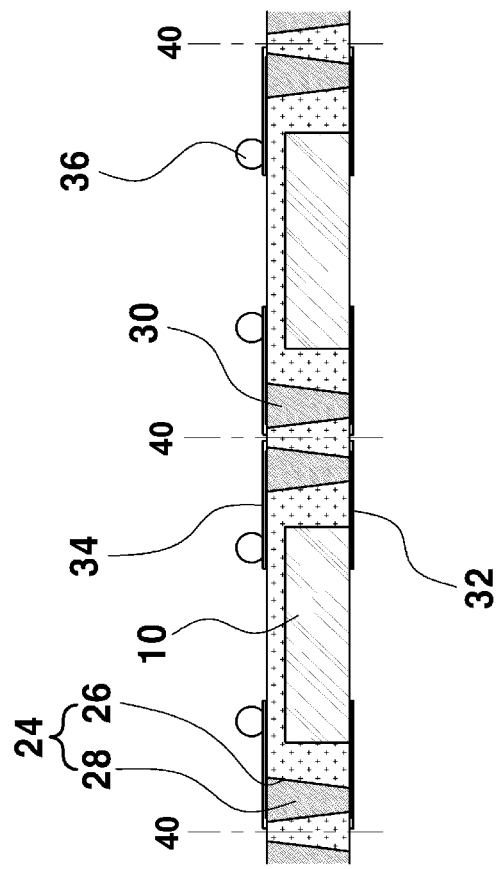
Figure 3G:
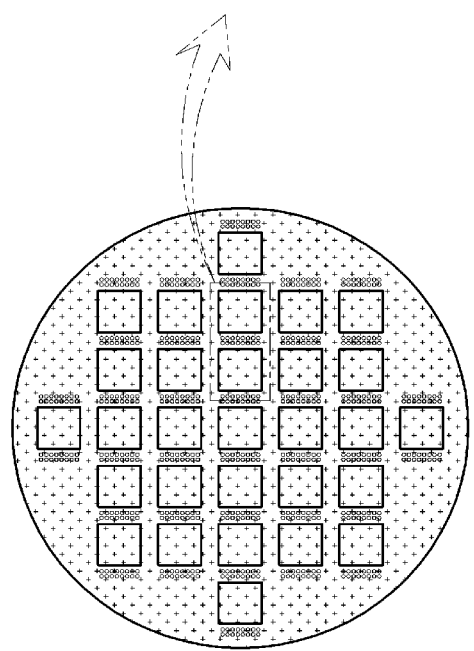

Next, input/output terminal (36), such as a solder ball, may be heated to melting state thereby coupling it to a ball pad, that is, a distal end of the upper redistribution layer (34) extending to a desired position on the upper surface of the molding compound resin (30), as illustrated in FIG. 3G.

Figure 3H:
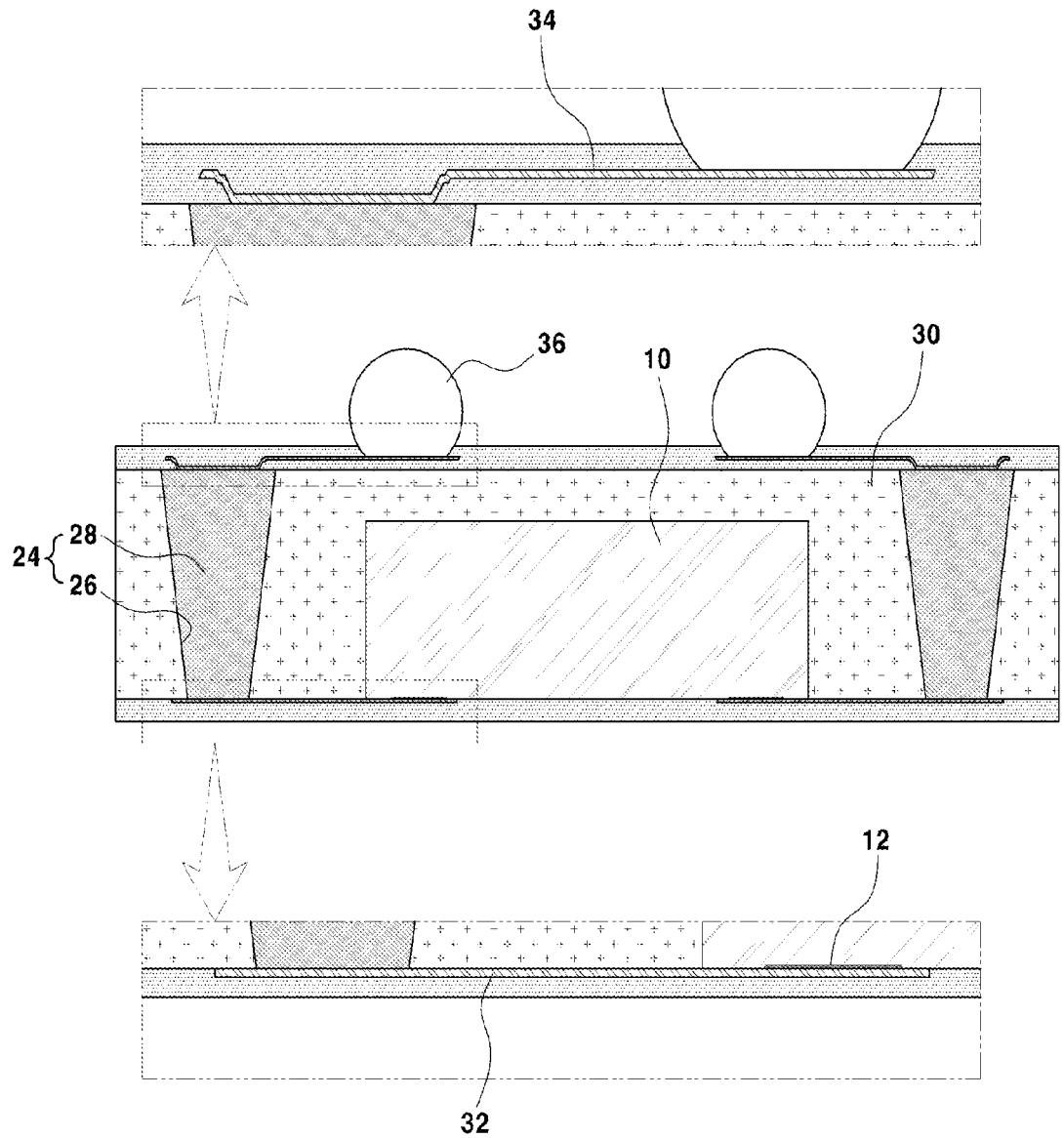

Finally, the individual packages of the molding compound resin are separated using a sawing process along sawing lines 40. Consequently, the resulting Wafer Level Fan-Out Package including the through mold via (22) and the solder ball (36), which are formed on the individual chips (10) and its surroundings, is shown in FIG. 3H Since all of the semiconductor chips and its surrounding parts are encapsulated by the molding compound resin, it is difficult to form a drilling hole, that is a via hole, for a plurality of through mold via holes at an exact location on the semiconductor chips and its surrounds, while the laser processing for forming the through mold via at the molding compound resin is performed several times.

When the laser processing is performed, the laser drilling for forming a via hole from the upper surface of the molding compound resin to the lower surface thereof can be performed in a state that an edge portion of the semiconductor chip may be recognized as a standard coordinate by using the X-ray examination. However, an error by a micro meter at the array spacing between the individual semiconductor chips may occur in the process of attaching the plurality of semiconductor chips to the adhesive surface with predetermined intervals. In addition, when the process of forming the lower redistribution layer is in progress, it may be slightly out of position. Consequently, it is difficult to accurately form the via hole from a certain position on the surface of the molding compound resin, corresponding to the individual semiconductor chips and its surroundings, to the lower redistribution layer using laser processing.

Aspects of the present invention solve the above-mentioned problems, and provide a semiconductor device and a method of manufacturing the same, which can form a via hole from a surface of the molding compound resin to a lower redistribution layer around the individual semiconductor chips at an accurate location and an accurate interval, utilizing a fiducial die on a wafer at a position adjacent to the semiconductor chip, which enables the laser drilling means to recognize a fiducial pattern of the fiducial die as a standard coordinate while performing the laser drilling, when a plurality semiconductor chips are attached an adhesive surface with predetermined intervals.

In accordance with an aspect of the present invention, there is provided a semiconductor device comprising: a fiducial die being disposed at a predetermined position adjacent to a semiconductor chip sawed after being subjected to the wafer sawing process; a molding compound resin for encapsulating and guarding the semiconductor chip and the fiducial die in such a manner that an upper surface of the fiducial die can be exposed to the outside; a lower redistribution layer extending from a bonding pad of the individual semiconductor chip to a desired position at a lower surface of the molding compound resin; a through mold via including a via hole and a conductive metal material to be filled in the via hole, the via hole being formed from an upper surface of the molding compound resin to the lower surface of the molding compound resin on which the redistribution layer is provided by using laser drilling such that a laser drilling means can recognize the fiducial die as a standard coordinate; an upper redistribution layer extending from an upper end of the through mold via of a mold interposer to a desired position on an upper surface of the molding compound resin by performing a plating process; and input/output terminals being conductively melted and coupled to a ball pad of the upper redistribution layer.

The fiducial die may comprise a transparent member having a thickness larger than the thickness of the semiconductor device, and a fiducial pattern formed at a lower surface of the transparent member. The transparent member of the fiducial die may comprise glass materials and the fiducial pattern may comprise the same material as the lower redistribution layer while performing the process of forming the lower redistribution layer.

In accordance with another aspect of the present invention, there is provided a method of manufacturing a semiconductor device, comprising the steps of: attaching a plurality of semiconductors to an adhesive surface with predetermined intervals and simultaneously attaching a fiducial die having a thickness larger than the thickness of the semiconductor device to the adhesive surface at a position adjacent to the semiconductor device; molding the individual semiconductor chip and the fiducial die together by means of a molding compound resin; grinding an upper surface of the molding compound resin so as to expose an upper surface of the fiducial die to the outside; forming a lower redistribution layer from a bonding pad of the individual semiconductor chip to a desired position on a lower surface of the molding compound resin after forcibly detaching the molding compound resin encapsulating the semiconductor chip and the fiducial die from the adhesive surface; forming a via hole from the upper surface of the molding compound resin to the lower surface of the molding compound resin on which the redistribution layer is provided by performing laser drilling such that the laser drilling means may recognize the fiducial die as a standard coordinate; completing a through mold via by filling the lower redistribution layer and a conductive metal material in the via hole; and melting an input/output terminal and then coupling it to a ball pad of an upper redistribution layer after forming the upper redistribution layer from an upper end surface of the perforated mold via to a desired position on the upper surface of the molding compound resin.

The fiducial die may be provided with a fiducial pattern for allowing the laser drilling means to recognize it as a standard coordinate with the aid of a transparent member of the fiducial die when the fiducial die is attached to the adhesive surface together with the semiconductor device, in which the fiducial pattern is pre-formed on a lower surface of the transparent member. A fiducial pattern may be formed at a lower surface of a transparent member of the fiducial die when the redistribution layer is formed from the bonding pad of the semiconductor chip to a desired position of the molding compound resin, in which the fiducial pattern is made of the same material as the lower redistribution layer.

As described above, according to the present invention, when a Wafer Level Fan-Out Package is produced, the fiducial die may be formed on an adhesive surface at a predetermined location adjacent to a semiconductor chip, which is capable of allowing the laser drilling means to recognize the fiducial pattern of the fiducial die as a standard coordinate while performing the laser drilling. Accordingly, it is possible to form a via hole at an accurate position and an accurate interval, wherein the via hole may be formed from a surface of the molding compound resin to the lower redistribution layer disposed at a location adjacent to the individual semiconductor chip, by using the laser drilling.

In other words, it is possible to form the via hole of a through mold via at an accurate location and an accurate spacing, by making the laser drilling means to recognize the fiducial die disposed at a location adjacent to the individual semiconductor chip as a standard coordinate while performing the laser drilling, even though a minute interval error may be present between a plurality of semiconductor chips or a lower redistribution layer is out of its position resulting in a minor positioning error.

In particular, when the plating process for forming the lower redistribution layer is performed, the fiducial pattern may be formed at the fiducial die by using the same material as the lower redistribution layer. Furthermore, the spacing between the fiducial pattern and the lower redistribution layer remains constant. As a result, the laser drilling means may accurately recognize the fiducial pattern as a standard coordinate and thereby result in the formation of the via hole at an accurate location.

The present invention provides a Wafer Level Fan-Out Package, which is capable of forming a via hole of a through mold via at an accurate location by a laser drilling, even though a minute interval error may be present between a plurality of semiconductor chips or a lower redistribution layer is out of its position, resulting in a minor positioning error.

Hereinafter, a semiconductor device and a method of manufacturing the same according to the first exemplary embodiment of the present invention, will be described in more detail with reference to the accompanying drawings.

Figures 1A, 1B:
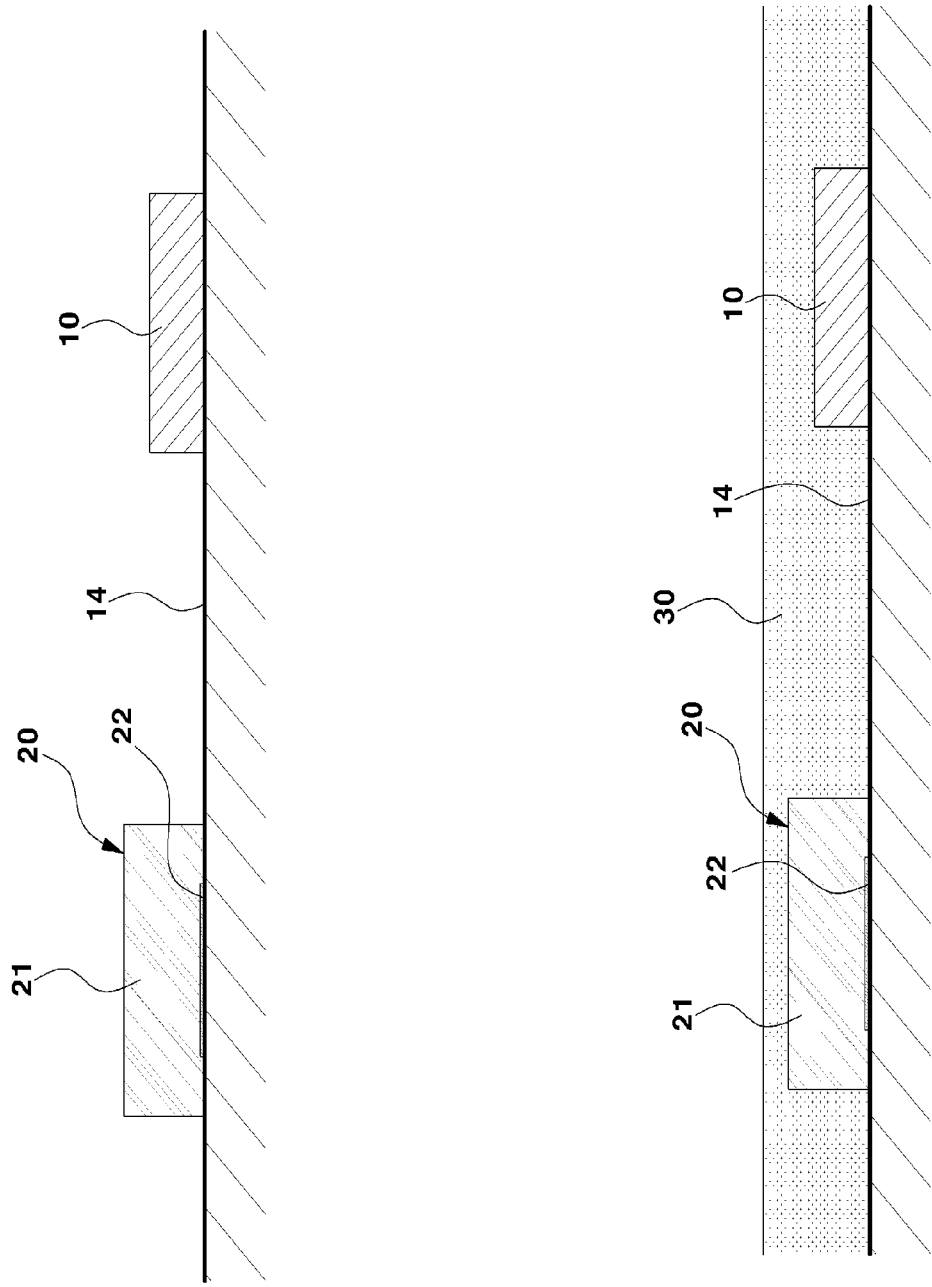
FIG. 1A-1E is a schematic cross sectional view of a semiconductor device and a method of manufacturing the same according to the first exemplary embodiment of the present invention.

Referring to FIGS. 1A to 1A, the reference numeral "20" denotes a fiducial die according to the first exemplary embodiment, which is disposed at a position adjacent to a semiconductor chip (10) sawed after being subjected to the wafer sawing process.

The fiducial die (20) according to the first exemplary embodiment comprises a transparent member (21) having a thickness larger than the thickness of the semiconductor device (10), and a fiducial pattern (22) embedded in or attached to a lower surface of the transparent member (21). In an example scenario, the fiducial pattern (22) comprises a thin metal film and the transparent member (21) comprises glass.

For example, the fiducial die (20) may comprise the transparent member (21) and the fiducial pattern (22) provided on the lower surface of the transparent member (21). In instances where the transparent member (21) comprises glass, it allows a worker to view the laser drilling means passing through the transparent member (21). The fiducial pattern (22) makes it possible for the laser drilling means to accurately recognize standard coordinates.

In order to make the semiconductor device according to the present invention, that is a Wafer Level Fan-Out Package, a plurality of semiconductor chips (10) may be attached on an adhesive surface (14) such as a tape or a carrier with predetermined intervals, as shown in FIG. 1A. In an example scenario, a surface having a bonding pad, that is to say, an input/output pad for an electrical signal formed thereon may be attached to the adhesive surface. At the same time, the fiducial die (20) having the fiducial pattern (22) formed at the lower surface of the transparent member (21) may be attached to the adhesive surface (14) at a position away from the semiconductor chip (10) at a predetermined distance.

In this example scenario, the thickness of the fiducial die (20) is greater than the thickness of the individual semiconductor device (10). Accordingly, when the fiducial die (20) is attached to the adhesive surface (14) together with the individual semiconductor device (10), the height of the fiducial die (20) is greater than the height of the individual semiconductor device (10).

Next, the individual semiconductor chip (10) and the fiducial die (20) may be molded together utilizing a molding compound resin (30) so that upper and side surfaces of the individual semiconductor chip (10), and upper and side surfaces of the fiducial die (20) are encapsulated and guarded by the molding compound resin (30), as illustrated in FIG. 1B.

When the individual semiconductor chip (10) and the fiducial die (20) are molded together by a molding compound resin (30), the fiducial die (20) may not directly contact an inner surface of the mold so as to prevent it from being damaged. As a result, the fiducial die (20) may be encapsulated and guarded by the molding compound resin.

Next, the upper surface of the molding compound resin (30) may be ground down so as to externally expose the upper surface of the fiducial die (20). At this time, the fiducial die (20) may be encapsulated and guarded by the molding compound resin of the semiconductor resin (10), as illustrated in FIG. 1C.

If the molding compound resin (30) encapsulating the semiconductor chip (10) and the fiducial die (20) is detached from the adhesive surface (14), the lower surface of the semiconductor chip, which has the bonding pad (12) provided thereon, may be exposed to the outside. Thereafter, the lower redistribution layer (32) from the bonding pad (12) of the individual semiconductor chip (10) to a desired position on the lower surface of the molding compound resin (30) may be formed using a typical plating process, as illustrated in FIG. 1C.

Figures 1C, 1D:
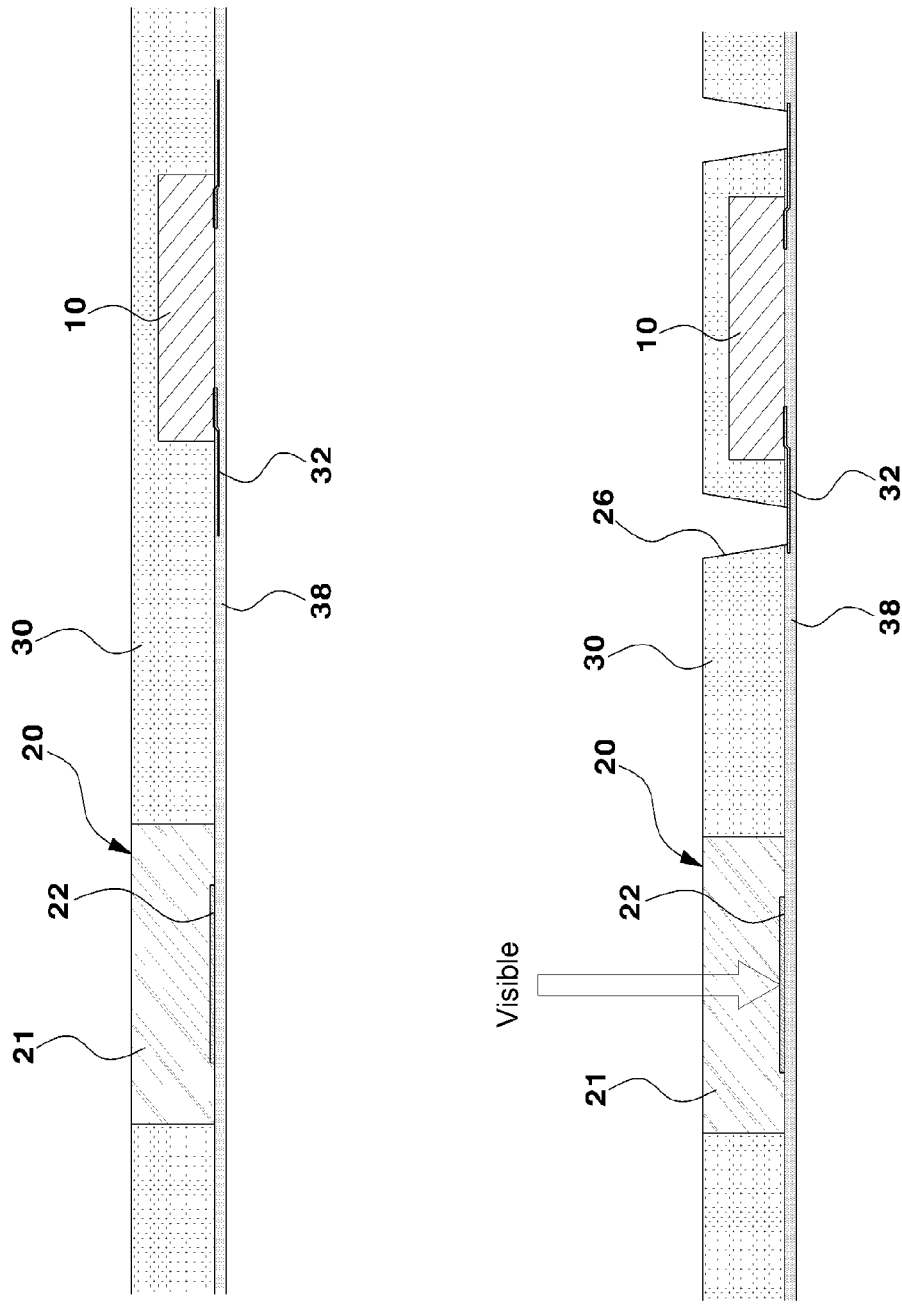
Figure 1E:
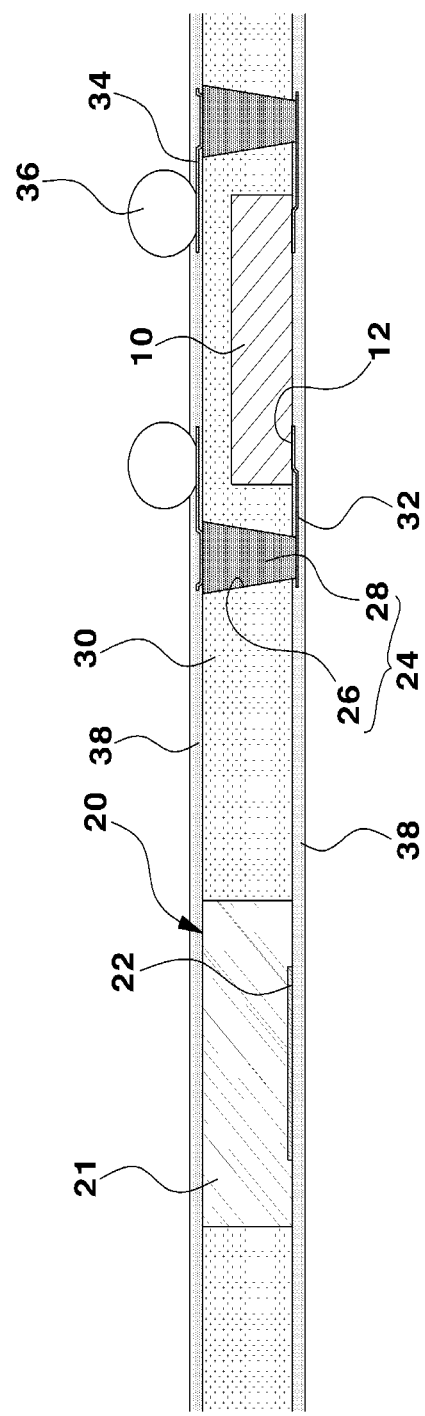

In the attached drawings FIG. 1C to 1E, the reference numeral "38" denotes a passivation layer for preventing moisture and foreign substances, etc. from permeating into the redistribution layer (32) and for preventing an electrical short between the redistribution layers. In an example embodiment, the passivation layer (38) comprises an insulating material.

Next, a via hole (26) from the upper surface of the molding compound resin (30) to the lower a lower surface of the molding compound resin (30) may be formed at which the lower redistribution layer (32) using laser drilling, as illustrated in FIG. 1D.

During the process of forming the via hole (26), the laser drilling means may recognize the fiducial pattern (22) of the fiducial die (20) as a standard coordinate with the aid of the transparent member (21) of the fiducial die (20). Accordingly, it is possible to form the via hole (26) at an accurate position, which is formed from the upper surface to the lower surface of the molding compound resin (30).

Thereafter, a conductive metal material (28) may be filled in the via hole (26), resulting in the formation of the through mold via (24) in the molding compound resin (30).

Next, an upper redistribution layer (34) may be formed extending from an upper end of the through mold via (24) to a desired position at an upper surface of the molding compound resin (30) utilizing a similar process as used in the formation of the lower redistribution layer (32). Then, an input/output terminal (36) may be heated to a melting state and coupled to a ball pad of the upper redistribution layer (34), which may be exposed to the outside via the passivation layer (38), at a distal end of the upper redistribution layer (34), as illustrated in FIG. 1E.

Finally, the structure may be sawn along a sawing line, that is, a boundary line between the individual packages of the molding compound resin, resulting in the completion of the individual Wafer Level Fan-Out Packages.

As described above, according to the first exemplary embodiment of the present invention, it is possible to form the via hole (26) from the surface of the molding compound resin to the lower redistribution layer at an accurate location and an accurate interval by utilizing laser drilling, even though a minute interval error may occur between a plurality of semiconductor chips or a lower redistribution layer is out of its position, resulting in a minor positioning error.

Hereinafter, a semiconductor device and a method of manufacturing the same according to the second exemplary embodiment of the present invention will be explained in detail with reference to the attached drawings.

Referring to FIGS. 2A to 2E, the reference numeral "20" denotes a fiducial die according to the second exemplary embodiment of the present invention, which is disposed at a position adjacent to a semiconductor chip (10) sawed after being subjected to the process of sawing the wafer.

The fiducial die (20) according to the second exemplary embodiment comprises a transparent member (21) having a thickness larger than the thickness of the semiconductor device (10), and a fiducial pattern (22) embedded in or attached to a lower surface of the transparent member (21) during the formation of the lower redistribution layer (32). In an example scenario, the transparent member (21) comprises glass.

As with the first exemplary embodiment, a plurality of semiconductor chips (10) may be attached to the adhesive surface (14) such as a tape or a carrier with predetermined intervals. In an example embodiment, a surface having a bonding pad, that is to say, an input/output pad for an electrical signal formed thereon may be attached to the adhesive surface. At the same time, the fiducial die (20) having the fiducial pattern (22) formed at the lower surface of the transparent member (21) may be attached to the adhesive surface (14) at a position away from the semiconductor chip (10) at a predetermined distance, as illustrated in FIG. 2A.

In an example scenario, the thickness of the fiducial die (20) may be greater than the thickness of the individual semiconductor device (10). Accordingly, when the fiducial die (20) is attached to the adhesive surface (14) together with the individual semiconductor device (10), the height of the fiducial die (20) is greater than the height of the individual semiconductor device (10). The fiducial die (20) attached to the adhesive surface (14) may be shown in FIGS. 2A and 2B with only the transparent member (21) without having the fiducial pattern (22).

Figures 2A, 2B:
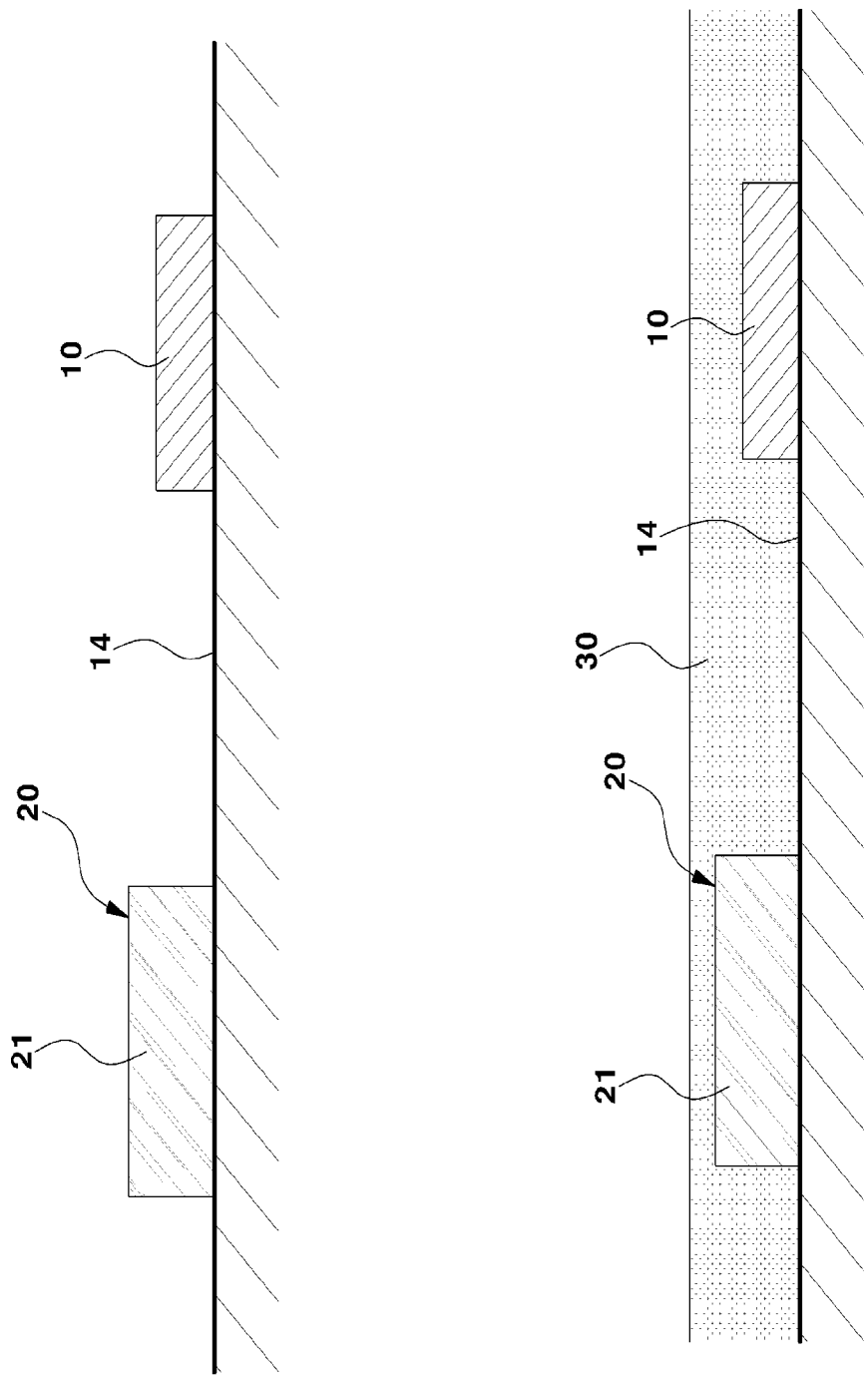
FIG. 2A-2E is a schematic cross sectional view of a semiconductor device and a method of manufacturing the same according to the second exemplary embodiment of the present invention.

Next, the individual semiconductor chip (10) and the fiducial die (20) may be molded together by a molding compound resin (30) so that upper and side surfaces of the individual semiconductor chip (10), and upper and side surfaces of the fiducial die (20) are encapsulated and guarded by the molding compound resin (30), as illustrated in FIG. 2B.

Figures 2C, 2D:
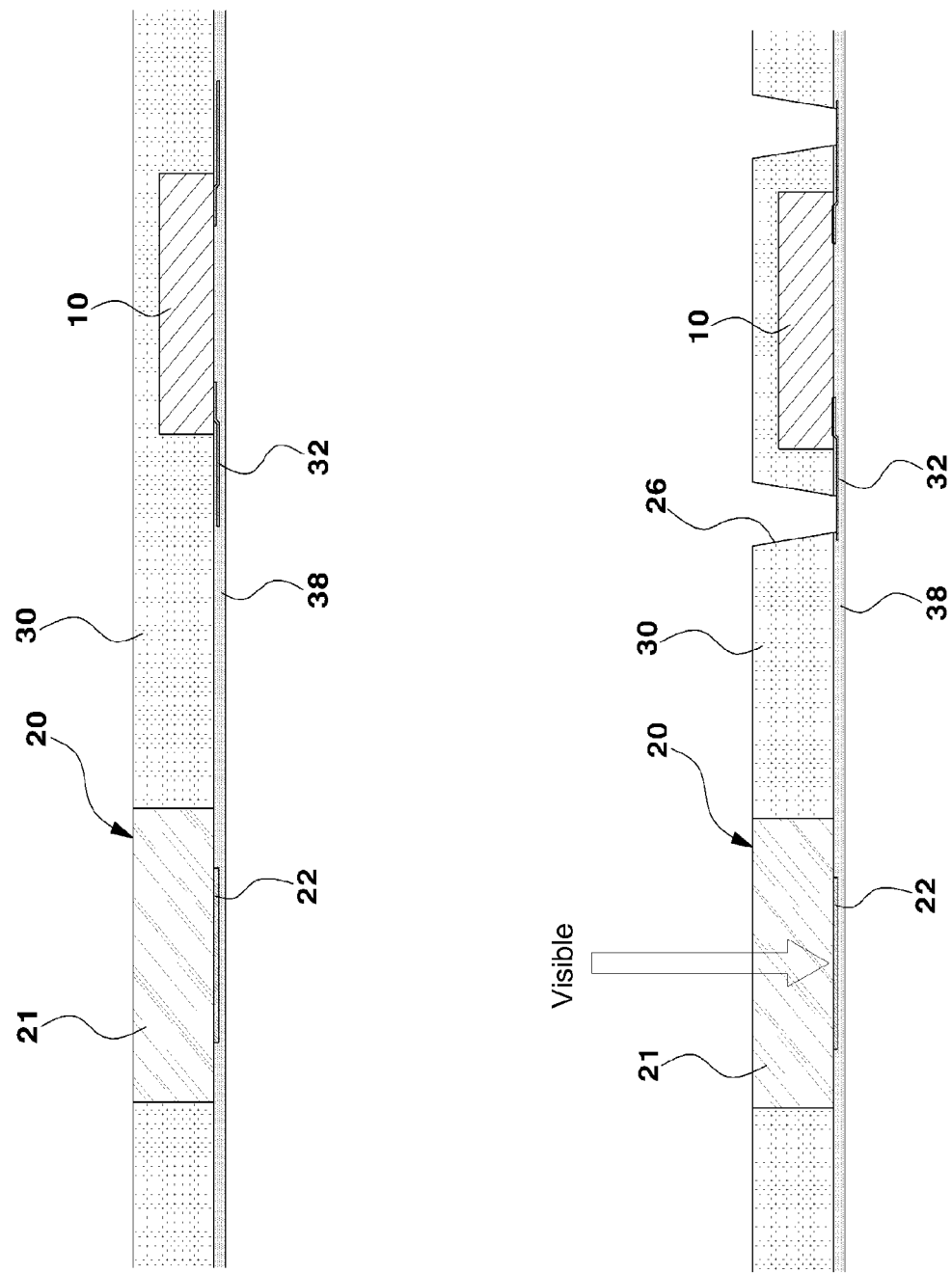

Thereafter, a process of grinding an upper surface of the molding compound resin (30) may proceed so as to externally expose an upper surface of the fiducial die (20). As a result, the upper surface of the transparent member (21) is substantially exposed to the outside, as illustrated in FIG. 2C.

After the grinding process has been completed, the molding compound resin (30) encapsulating the semiconductor chip (10) and the fiducial die (20) may be detached from the adhesive surface (14) so that the lower surface of the semiconductor chip having the bonding pad (12) provided thereon is exposed to the outside. Then, the lower redistribution layer (32) may be formed from the bonding pad (12) of the individual semiconductor chip (10) to a desired position on the lower surface of the molding compound resin (30) using a plating process, with the resulting structure shown in FIG. 2C.

When the lower redistribution layer (32) is formed from the bonding pad (12) of the individual semiconductor chip (10) to a desired position on the lower surface of the molding compound resin (30) as described, the fiducial pattern (22) may be formed on the lower surface of the transparent member (21) of the fiducial die (20) at the same time. In an example scenario, the fiducial pattern (22) may comprise the same materials as that used in the process of plating the lower redistribution layer (32).

If the lower redistribution layer (32) and the fiducial pattern (22) are formed in the same process, it is possible to maintain the exact spacing between the lower redistribution layer (32) and the fiducial pattern (22). As a result, laser drilling means may be enabled to accurately recognize the fiducial pattern as a standard coordinate.

Figure 2E:
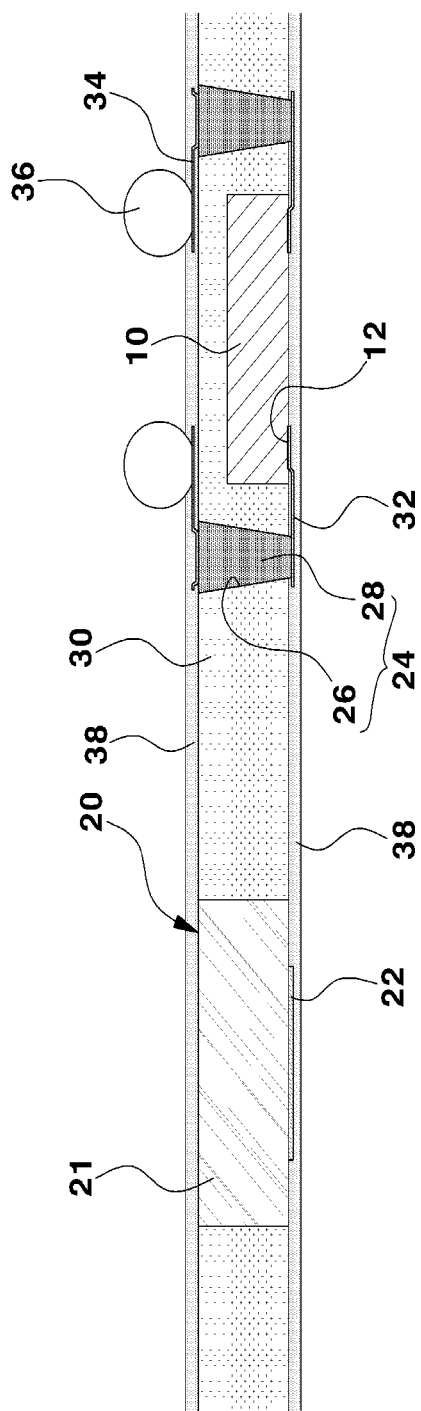

Referring to FIGS. 2C to 2E, the reference numeral "38" denotes a passivation layer for preventing moisture and foreign substances, etc. from permeating into the redistribution layer and for preventing the electrical short from being occurred between the redistribution layers. In an example embodiment, the passivation layer is made of an insulating material.

Next, a via hole (26) may be formed from the upper surface of the molding compound resin (30) to a lower surface of the molding compound resin (30) in which the lower redistribution layer (32) is provided, by using laser drilling, resulting in the structure illustrated in FIG. 2D.

The via hole (26) may then be formed such that the laser drilling means recognizes the fiducial pattern (22) of the fiducial die (20) as a standard coordinate with the aid of the transparent member (21) of the fiducial die (20). Accordingly, it is possible to form the via hole (26) at an accurate position, which may be formed from the upper surface to the lower surface of the molding compound resin (30).

Thereafter, a conductive metal material (28) may fill in the via hole (26), resulting in the formation of the through mold via (24) in the molding compound resin (30).

Next, an upper redistribution layer (34) may be formed extending from an upper end of the through mold via (24) to a desired position at an upper surface of the molding compound resin (30) in a similar manner to the formation of the lower redistribution layer (32). Then, an input/output terminal (36) may be heated to a state of melting and coupled to a ball pad of the upper redistribution layer (34), which may be exposed to the outside via the passivation layer (38), at a distal end of the upper redistribution layer (34). The resulting structure is illustrated in FIG. 2E.

Finally, as with the first exemplary embodiment, a process of sawing the structure along a sawing line, that is, a boundary line between the individual packages of the molding compound resin, may be utilized to result in the completion of the individual Wafer Level Fan-Out Packages.

Although exemplary embodiments of the present invention have been described for illustrative purposes, those skilled in the art will appreciate that various modifications, additions and substitutions are possible, without departing from the scope and spirit of the invention as disclosed in the accompanying claims.

A brief description of the reference numerals follows:
10: semiconductor chip
12: bonding pad
14: adhesive surface
20: fiducial die
21: transparent member
22: fiducial pattern
24: through mold via
26: via hole
28: conductive metal material
30: molding compound resin
32: lower redistribution layer
34: upper redistribution layer
36: input/output terminal
38: passivation film This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

In an embodiment of the invention, a wafer level fan-out package with a fiducial die may comprise a semiconductor die and a transparent fiducial die both encapsulated in a molding compound resin, passivation layers on an upper surface and a lower surface of the molding compound resin except where redistribution layers are formed on upper and lower surfaces of the molding compound resin; and a metal pattern on a lower surface of the transparent fiducial die that is visible through an exposed upper surface of the transparent fiducial die. The pattern may comprise a standard coordinate for forming a through mold via utilizing laser drilling. The through mold via may extend from the upper surface to the lower surface of the molding compound resin for electrically coupling a redistribution layer on the upper surface of the molding compound resin to a redistribution layer on the bottom surface of the molding compound resin. The pattern may be embedded in the lower surface of the fiducial die. The pattern may be deposited on the lower surface of the fiducial die. The redistribution layer on the lower surface of the molding compound resin may be electrically coupled to a bonding pad on the semiconductor die. An input/output terminal may be formed on the redistribution layer on the upper surface of the molding compound resin. The input/output terminal may comprise a solder bump. The transparent fiducial die may be thicker than the semiconductor die. The transparent fiducial die may comprise a glass material. The pattern on the lower surface of the transparent fiducial die may comprise the same material as the redistribution layer on the on the bottom surface of the molding compound resin. The formed through mold via may comprise a conductive metal material.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor device comprising:
   a semiconductor die and a transparent fiducial die both encapsulated in a molding compound resin;
   an upper passivation layer on an upper surface of the molding compound resin except where an upper redistribution layer is formed on the upper surface of the molding compound resin;
   a lower passivation layer on a lower surface of the molding compound resin except where a lower redistribution layer is formed on the lower surface of the molding compound resin;
   a metal pattern on a lower surface of the transparent fiducial die that is visible through an exposed upper surface of the transparent fiducial die; and
   a through mold via formed in the mold compound resin utilizing laser drilling recognizing the metal pattern as a standard coordinate, wherein said through mold via extends from the upper surface to the lower surface of the molding compound resin for electrically coupling the upper redistribution layer to the lower redistribution layer.

2. The semiconductor device according to claim 1, wherein the pattern is embedded in the lower surface of the fiducial die.

3. The semiconductor device according to claim 1, wherein the pattern is deposited on the lower surface of the fiducial die.

4. The semiconductor device according to claim 1, wherein the lower redistribution layer is electrically coupled to a bonding pad on the semiconductor die.

5. The semiconductor device according to claim 1, wherein an input/output terminal is formed on the upper redistribution layer.

6. The semiconductor device according to claim 5, wherein the input/output terminal comprises a solder bump.

7. The semiconductor device according to claim 1, wherein the transparent fiducial die is thicker than the semiconductor die.

8. The device according to claim 1, wherein the transparent fiducial die comprises a glass material.

9. The semiconductor device according to claim 1, wherein the pattern on the lower surface of the transparent fiducial die comprises the same material as the lower redistribution layer.

10. The semiconductor device according to claim 1, wherein the formed through mold via comprises a conductive metal material.

11. A method for a semiconductor device, the method comprising:
- encapsulating a semiconductor die and a transparent fiducial die in a molding compound resin;
- forming passivation layers on a portion of an upper surface and a portion of a lower surface of the molding compound resin;
- forming a redistribution layer on an upper surface of the molding compound resin;
- forming a redistribution layer on a lower surface of the molding compound concurrently with a metal pattern on a lower surface of the transparent fiducial die, wherein the pattern is visible through an exposed upper surface of the transparent fiducial die; and
- forming a through mold via utilizing laser drilling wherein the metal pattern formed on the lower surface of the transparent fiducial die comprises a standard coordinate for the laser drilling and wherein the through mold via extends from the upper surface to the lower surface of the molding compound resin.

12. The method according to claim 11, comprising embedding the pattern in the lower surface of the fiducial die.

13. The method according to claim 11, comprising depositing the pattern on the lower surface of the fiducial die.

14. The method according to claim 11, wherein the redistribution layer on the lower surface of the molding compound resin is electrically coupled to a bonding pad on the semiconductor die.

15. The method according to claim 11, wherein an input/output terminal is formed on the redistribution layer on the upper surface of the molding compound resin.

16. The method according to claim 15, wherein the input/output terminal comprises a solder bump.

17. The method according to claim 11, wherein the transparent fiducial die is thicker than the semiconductor die.

18. The method according to claim 11, wherein the transparent fiducial die comprises a glass material.

19. The method according to claim 11, comprising filling a hole resulting from the laser drilling with a conductive metal material to form the formed through mold via.

20. A semiconductor device comprising:
- a semiconductor die and a transparent fiducial die both encapsulated in a molding compound resin;
- passivation layers on an upper surface and a lower surface of the molding compound resin except where redistribution layers are formed on upper and lower surfaces of the molding compound resin;
- a metal pattern on a lower surface of the transparent fiducial die that is visible through an exposed upper surface of the transparent fiducial die; and
- a through mold via formed in the molding compound resin utilizing laser drilling recognizing the metal pattern as a standard coordinate, wherein said through mold via extends from the upper surface to the lower surface of the molding compound resin and is filled with metal for electrically coupling a redistribution layer on the upper surface of the molding compound resin to a redistribution layer on the bottom surface of the molding compound resin.

* * * * *